(12) United States Patent
Rochard (10) Patent No.: US 6,366,125 B1
(45) Date of Patent: Apr. 2, 2002

(54) DIGITAL OUTPUT CIRCUIT

(75) Inventor: Laurent Rochard, Cabries (FR)

(73) Assignee: STMicroelectronics S.A., Gentilly (FR)

( * ) Notice: Subject to any disclaimer, the term of this patent is extended or adjusted under 35 U.S.C. 154(b) by 0 days.

(21) Appl. No.: 09/547,174

(22) Filed: Apr. 11, 2000

(30) Foreign Application Priority Data

Apr. 13, 1999 (FR) ............................................. 99 04609

(51) Int. Cl.[7] .......................................... H03K 19/0175
(52) U.S. Cl. .......................................... 326/82; 326/83
(58) Field of Search ............................ 326/82, 83, 86, 326/89, 88, 92, 29; 327/134, 170

(56) References Cited

U.S. PATENT DOCUMENTS

| | | | |
|---|---|---|---|
| 4,320,521 A | * 3/1982 | Balakrishnan et al. | ........ 326/89 |
| 4,855,626 A | * 8/1989 | Bohme | ........................ 326/89 |
| 5,734,272 A | 3/1998 | Belot et al. | |
| 5,767,699 A | 6/1998 | Bosnyak et al. | |
| 5,801,564 A | 9/1998 | Gasparik | |
| 5,886,554 A | 3/1999 | Corsi et al. | |

FOREIGN PATENT DOCUMENTS

EP 0 793 345 A1 9/1997

OTHER PUBLICATIONS

French Search Report dated Dec. 2, 1999 with Annex to French Application No. 99 04609.

* cited by examiner

*Primary Examiner*—Michael Tokar
*Assistant Examiner*—Don Phu Le
(74) *Attorney, Agent, or Firm*—Lisa K. Jorgenson; Stephen Bongini; Fleit, Kain, Gibbons, Gutman & Bongini P.L.

(57) ABSTRACT

A digital signal output circuit is provided. The digital signal output circuit includes capacitor forming means connected as an integrator, charging means, discharging means, means for selectively coupling, and a digital signal output. The charging means selectively charges the capacitor forming means with a constant charging current, and the discharging means selectively discharges the capacitor forming means with a constant discharging current. The means for selectively coupling selectively couples the capacitor forming means to the charging means and to the discharging means as a function of data to be transmitted by the digital signal. Additionally, the digital signal output is coupled to the capacitor forming means so as to establish a rising edge of the digital signal when the capacitor forming means is coupled to the charging means and a falling edge of the digital signal when the capacitor forming means is coupled to the discharging means. In a preferred embodiment, the constant charging current and the constant discharging current have the same magnitude so as to produce the digital signal with symmetrical rising and falling edges. Also provided is a digital signal output circuit for outputting binary digital signals in the form of differential pairs on data transmission channels.

24 Claims, 8 Drawing Sheets

DIGITAL OUTPUT CIRCUIT

CROSS-REFERENCE TO RELATED APPLICATIONS

This application is based upon and claims priority from prior French Patent Application No. 99-04609, filed Apr. 13, 1999, the entire disclosure of which is herein incorporated by reference.

BACKGROUND OF THE INVENTION

1. Field of the Invention

The present invention relates to digital signals, and more specifically to digital signal shaping for digital data transmissions between different units of data processing, instrumentation, or communications equipment.

2. Description of Related Art

A digital signal has the form of a voltage or current that alternates between two possible levels: a "high" level and a "low" level. A binary value (i.e., 0 or 1) is attributed to each of these two states. The transitions between the two levels of the signal form a corresponding series of binary values. This series of binary values carries information transmitted with the signal between a source and one or several reception points. The binary signals of a given protocol must conform to a specification which establishes their electrical characteristics such as the voltage or current levels that correspond to the logic values 0 and 1, the rise and fall times from one level to another, and the duration of a logic state. It is essential that the specification is rigorously complied with in order to correctly recognizing the exchanged data.

Figure 1:
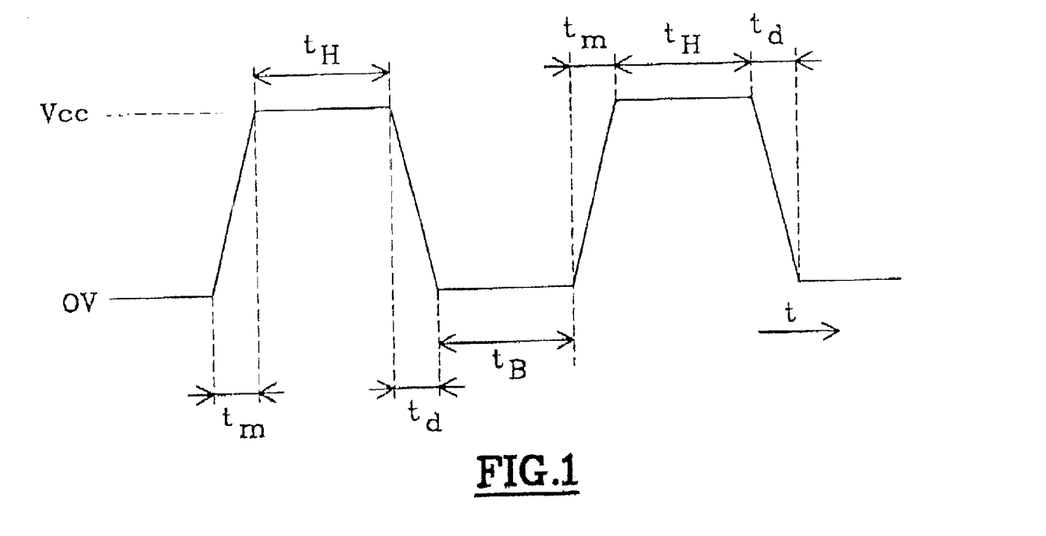
FIG. 1 is a timing diagram of a binary digital signal in the form of a voltage waveform.

FIG. 1 shows a portion of a binary signal in the form of a voltage pulse (shown on the Y axis) that changes over time (shown on the X axis). An element of binary information 1 or 0 is represented by the presence of a voltage at the high level, which is determined by Vcc, or the low level, which is set at 0 V. These voltage levels must exist during predetermined time periods $t_H$ and $t_B$, respectively. A transition from the low level to the high level (or "rising edge") takes a relatively short finite time $t_m$. The same applies for the time $t_d$ for a transition from the high level to the low level (or "falling edge"). In the example of FIG. 1, the binary signal is symmetrical insofar as the times $t_H$ and $t_B$ of the high and low levels are identical, as are the transition times $t_m$ and $t_d$ between those levels.

Figure 2:
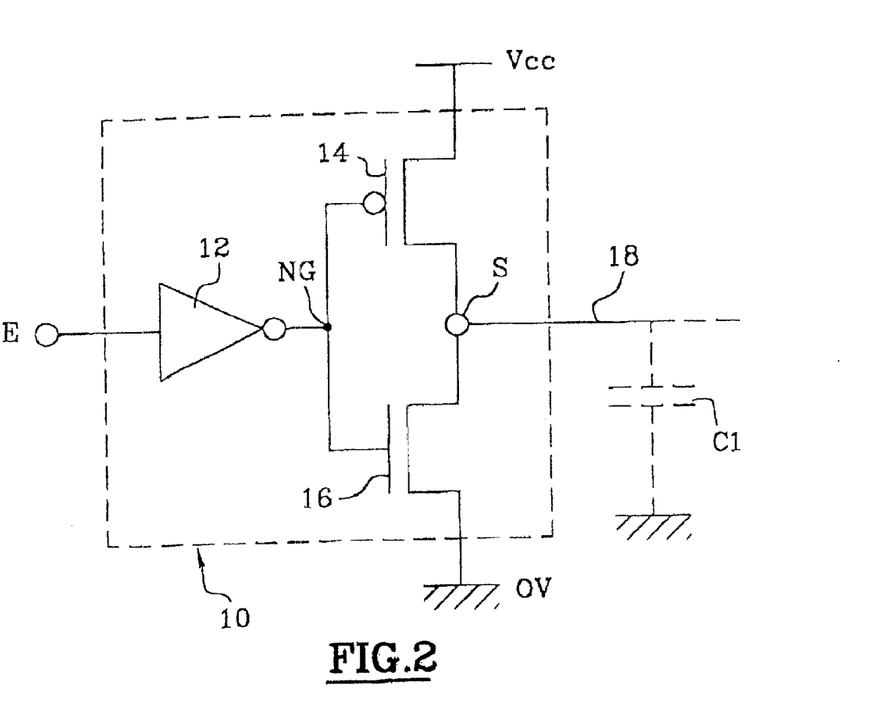
FIG. 2 is a diagram of a conventional output stage for driving a binary digital signal transmission line.

When a binary signal is to be transmitted by a cable over distances beyond a few centimeters, and possibly a few meters, the electrical characteristics of the cable in terms of resistance, capacitance, and induction, which are proportional to its length, create a load which tends to attenuate and modify the shape of the voltage or current waveforms. To prevent this phenomenon from causing a loss of transmission quality, it is required to send the binary signal through a relatively low impedance output stage which can switch rapidly between the levels. FIG. 2 shows an one such conventional output stage.

The output stage 10 includes an input terminal E which receives the binary signal before it is appropriately shaped for transmission along a line. For example, the binary input signal can come from a large-scale integration logic circuit. In general, the output stages of such circuits are not capable of driving a lossy transmission line. The purpose of the output stage is to apply this input signal onto the transmission line with a low output impedance. The input E is connected to a logic inverter 12 whose output is connected to each gate of first and second complementary MOS transistors 14 and 16. These transistors are connected in series between a supply voltage line Vcc and ground to form another inverter.

The first and second transistors 14 and 16 are PMOS and NMOS type transistors, respectively. The source of the first transistor 14 is connected to the voltage line Vcc and its drain is connected to the source of the second transistor 16. The drain of the second transistor 16 is connected to a 0 V (or ground) line. The output S of the output stage 10 is located at a connection node between the first and second transistors 14 and 16. This output S drives a transmission line 18 which exhibits a capacitive loss symbolized by a capacitor C1 (shown in dotted lines) that connects the transmission line 18 to ground.

The first and second transistors 14 and 16 are specially designed to deliver or absorb a high current. To this end, they possess a conduction channel of relatively large dimensions, which thus provides a low resistance. The presence of the logic inverter 12 serves to establish a double inversion of the digital signal supplied at the input (i.e., in combination with the inverter formed by transistors 14 and 16). As a result, the signals at the input E are reproduced with the same polarity at the output S. When the digital signal at the node NG connecting the gates of transistors 14 and 16 is at 0 V (which corresponds to a high level at input E), the second transistor 16 is OFF while the first transistor 14 is switched ON. Accordingly, the output S is connected to the supply voltage line Vcc via transistor 14. Conversely, when the digital signal at node NG is at the supply voltage level Vcc, the first transistor 14 is OFF and the second transistor 16 is switched ON. Thus, the output S is connected to ground via transistor 16.

The voltage level transitions at the output S (either to the high or to the low state) depend on the characteristics of the first 14 and second 16 transistors. In particular, these transistors determine the rise and fall times of the digital signal on the transmission line 18. Generally, it is desirable for the rise and fall times of the digital signal be the same (i.e., for the rising and falling edges of the signal to have the same shape as shown in FIG. 1). This implies identical characteristics for transistors 14 and 16, which are respectively of the PMOS and NMOS types. In particular, the critical characteristics are the switching thresholds of the transistors (i.e., the voltage level required to set the transistors into saturation) and the channel resistances.

However, in practice, PMOS and NMOS transistors cannot be rigorously identical with regard to these characteristics. In particular, the threshold voltage is determined at the fabrication stages, which are different depending on whether the transistor is a PMOS or NMOS transistor. Accordingly, the rising and falling edges cannot be perfectly symmetrical with an output stage of the type shown in FIG. 2. Moreover, in practice, there is a difference in the above-mentioned characteristics between two theoretically identical output stages 10 because of inevitable dispersions in the fabrication processes. This adds to the lack of symmetry due to the inherent differences between the PMOS and NMOS transistors when the digital signal is sent in the form of differential pairs. According to such a transmission mode, the digital data is sent on each of two transmission channels (for example, a pair of wires).

Figure 3:
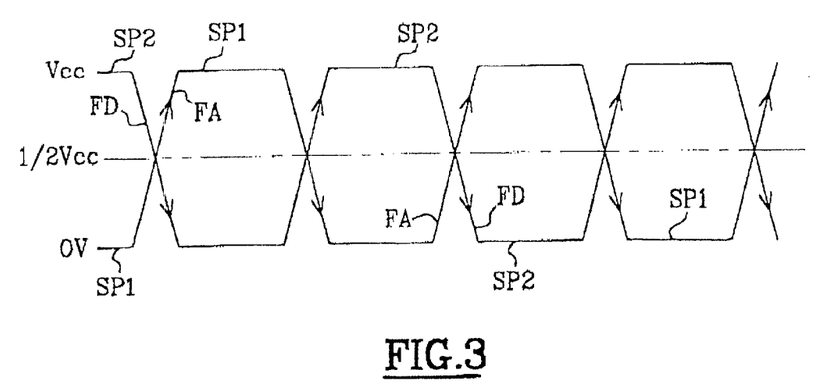
FIG. 3 is a timing diagram of a theoretical data transmission in the form of differential pairs.

FIG. 3 shows the superposition of the theoretical shape of each signal of the digital signal pair of a differential pair transmission. These signals SP1 and SP2 are of mutually opposite levels, with one being fixed as the inverse of the other. In this example, the high and low levels of the signals are respectively at voltages Vcc and 0 V. A protocol establishes which of the two signals SP1 or SP2 is indexed to the logic levels of the transmitted data, and the other signal serves to establish the reference for the potential difference. The rising edges $F_A$ and the falling edges $F_D$ of the two signals are symmetrical, so their crossover points at the level transitions are always located at the median level (i.e., at ½ Vcc in this example).

Data transmission in the form of differential pairs occupies two channels instead of a single channel (e.g., as with a simple serial link), but provides good immunity against noise. Differential pair transmission is used for applications such as data processing for connecting peripherals between themselves or to a central processing unit. For example, there has recently been defined a transmission protocol that is refereed to as the universal serial bus (USB) for data busses that connect computer equipment hardware. Under the USB protocol, the digital signals are sent in the form of differential pairs. The USB is now being used in the field of personal computing and is intended to provide a universal platform for communication with the computer itself and peripherals such as a mouse, keyboard, printer, scanner, camera, speakers, and the like.

The USB scheme serves to provide an interface between a digital unit that is specially devised for the USB functions and the transmission cable. Such a functional unit is purely analog and serves to send digital signals with a waveform such as is set out in the USB specification ("Universal Serial Bus Revision 1.1, Chapter 7 "Electrical Specification", available on the Internet at "www.usb.org"). This specification establishes the operational signals (D+/D−), the high and low levels, the rise and fall times, the crossover levels, the input levels, impedance matching, and so on. The USB specification sets out two transmission speeds: a low transmission speed (LOW SPEED) of 100 kbits/s and a high transmission speed (FULL SPEED) of 12 Mbits/s). The output signals must have a rise time of between 4 ns and 20 ns for full speed transfer, and between 75 ns and 300 ns for low speed transfer.

Figure 4:
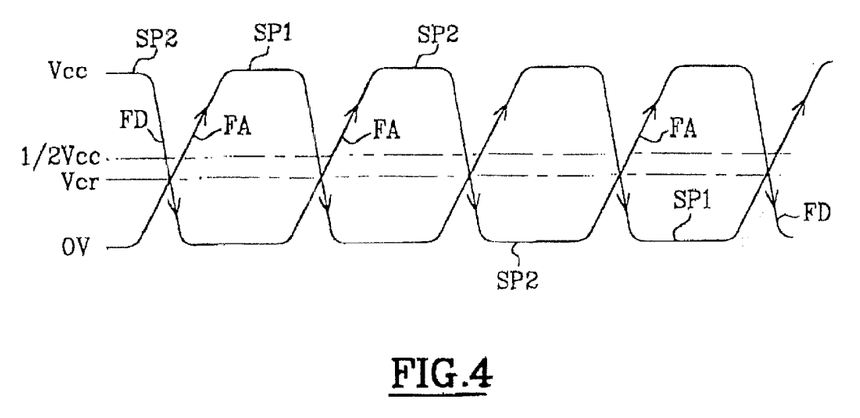
FIG. 4 is a timing diagram illustrating the actual form of the signals of FIG. 3 when they are delivered by the conventional output stage of FIG. 2.

FIG. 4 shows the actual shape of the digital signals of FIG. 3 when they are processed by the output stage of FIG. 2. As shown, there is a first asymmetry between the rising edges $F_A$ and the falling edges $F_D$ of one signal SP1 or SP2 of the pair due to the characteristic differences between the PMOS and NMOS transistors of the individual output stages. This results in the crossover points of the two signals SP1 and SP2 being located at a voltage $V_{CR}$ which is staggered with respect to the median voltage level of ½ Vcc. Such a staggering is highly undesirable because it is a source of signal detection errors. Moreover, it decreases the noise immunity of the transmission line.

Additionally, each of the two signals SP1 and SP2 is produced by a separate output stage 10, which can introduce an additional asymmetry. For example, the signals SP1 and SP2 can exhibit differences at the level of their rising edges $F_A$ or falling edges $F_D$. Further, as shown in FIG. 4, the signals SP1 and SP2 differ from the theoretical signals of FIG. 3 by the fact that the ends of the rising and falling edges $F_A$ and $F_D$ exhibit a continuous variation, and pass progressively from the transition state to the stationary state (high level or low level). This effect, which gives rise to a non-linearity of the edges, is due to the non-infinite switching speed of the transistors 14 and 16, and can generate a loss of transmission quality.

SUMMARY OF THE INVENTION

In view of these drawbacks, it is an object of the present invention to overcome the above-mentioned drawbacks and to provide a digital signal output circuit that drives a data transmission line with good uniformity conditions, especially with regard to the symmetry between the rising and falling edges.

One embodiment of the present invention provides a digital signal output circuit that includes capacitor forming means connected as an integrator, charging means, discharging means, means for selectively coupling, and a digital signal output. The charging means selectively charges the capacitor forming means with a constant. charging current, and the discharging means selectively discharges the capacitor forming means with a constant discharging current. The means for selectively coupling selectively couples the capacitor forming means to the charging means and to the discharging means as a function of data to be transmitted by the digital signal. Additionally, the digital signal output is coupled to the capacitor forming means so as to establish a rising edge of the digital signal when the capacitor forming means is coupled to the charging means and a falling edge of the digital signal when the capacitor forming means is coupled to the discharging means. In a preferred embodiment, the constant charging current and the constant discharging current have the same magnitude so as to produce the digital signal with symmetrical rising and falling edges.

Another embodiment of the present invention provides a digital signal output circuit for outputting binary digital signals in the form of differential pairs on data transmission channels. The digital signal output circuit includes a pair of capacitor forming means connected as integrators, charging means, discharging means, means for selectively coupling, and a pair of digital signal outputs. The charging means selectively charges the capacitor forming means with a constant charging current, and the discharging means selectively discharges the capacitor forming means with a constant discharging current. The means for selectively coupling selectively couples the capacitor forming means to the charging means and to the discharging means as a function of data to be transmitted by the digital signal. Each of the digital signal outputs is coupled to one of the capacitor forming means so as to establish a rising edge at the digital signal output when the corresponding capacitor forming means is coupled to the charging means and a falling edge at the digital signal output when the corresponding capacitor forming means is coupled to the discharging means. In one preferred embodiment, the charging means and the discharging means are shared by the pair of digital signal outputs of the pair of data transmission channels, and one of the constant charging current and the constant discharging current is coupled to each of the digital signal outputs by switching means.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Preferred embodiments of the present invention provide a digital signal output circuit that drives a data transmission line with good uniformity conditions, especially with regard to the symmetry between the rising and falling edges. In one preferred embodiment, the digital signal output circuit includes capacitor forming means connected as an integrator, charging means for selectively charging the capacitor forming means with a constant current, discharging means for selectively discharging the capacitor forming means with a constant current, means for selectively coupling the capacitor forming means to the charging means and to the discharging means as a function of data to be transmitted by the outputted digital signal, and a digital signal output coupled to the capacitor forming means so as to establish a rising edge of the outputted digital signal when the capacitor forming means is coupled to the charging means and a falling edge of the outputted digital signal when the capacitor forming means is coupled to the discharging means.

Thus, the capacitor forming means ("capacitor") has the function of integrating the constant charging or discharging current. The charge of the capacitor then increases or decreases at a rate that is constant in time. Accordingly, the capacitor voltage, which is directly proportional to the charge of the capacitor, also increases or decreases at a constant rate. This results in an excellent linearity in the rising and falling edges of the digital signal. Further, the slope of the edges is determined by the value of the capacitor charging or discharging current. When the edges are to be symmetrical, the charging current and the discharging current must have the same value. The value of the constant current can be very stable and set with very high precision using conventional circuits such as those based on the well-known principles of the current mirror.

Moreover, it is simple to make the charging and discharging means symmetrical to obtain substantially the same magnitude for the charging and discharging currents. Thus, it is possible to obtain a perfect symmetry between the rising and falling edges. Such symmetry of edges is particularly well suited for the transmission of data in the form of differential pairs. In particular, it gives rise to the correct crossover of the rising and falling edges of the differential pair signals at exactly the median voltage level (i.e., ½ Vcc in the example of FIG. 3). Further, when used for the transmission of data in the form of differential pairs, it is possible to use two digital signal output circuits for the two channels of the pair, with the charging and discharging currents being made substantially identical for the two circuits.

In a preferred embodiment of the present invention, the capacitor is charged and discharged with a constant current via an operational amplifier that forms an active integrator with the capacitor. Advantageously with such a circuit, the constant current charging or discharging means is connected to the inverting (negative) input of the operational amplifier, the non-inverting input is connected to a reference potential, and the capacitor is connected between the inverting input and the output of the operational amplifier. The output of the operational amplifier supplies the shaped digital signals to a transmission line.

Preferably, the means for selectively connecting the charging and discharging means is formed by a switch that is controlled by a logic switching signal. The switch has a first input connected to the constant current charging means, a second input connected to the constant current discharging means, and an output selectively connectable to one of the first and second inputs as a function of the logic switching signal. The output of the switch is connected to the input of the integrator. With an active integrator, the input is formed by the inverting input of the operational amplifier. Accordingly, the rising and falling edges can be produced as a function of the switching commands supplied to the switch control input.

In some applications, it is desirable to be able to modify the slope of the rising and falling edges of the output signal (i.e., their rise time $t_m$ and fall time $t_d$). For example, this is the case with logic signals transmitted in differential pairs according to the USB specification, because they must exhibit specific rise and fall times depending on whether they correspond to the full speed or low speed transmission mode. To this end, some embodiments of the present invention allow this parameter to be controlled by adjusting the value of the charging and discharging current, because if the current is greater, the rise or fall time is shorter. Preferably, this control is performed by providing a number n of constant current charging and discharging means, with each being set to its own constant current value and being selectively connectable to the integrator.

However, it is also feasible to set the rise and fall times of the digital signals by modifying the capacitance of the charging capacitor of the integrator. This modification is obtainable by decomposing the capacitor into a plurality of fixed value capacitors which can be selectively put into and out of circuit by a switching means in order to produce the capacitance value providing the desired slope for a given charging or discharging current. It is also possible to use a variable capacitor. Preferably, the constant current charging means and the constant current discharging means share the same references which determine their charging and discharging rates.

Figure 5:
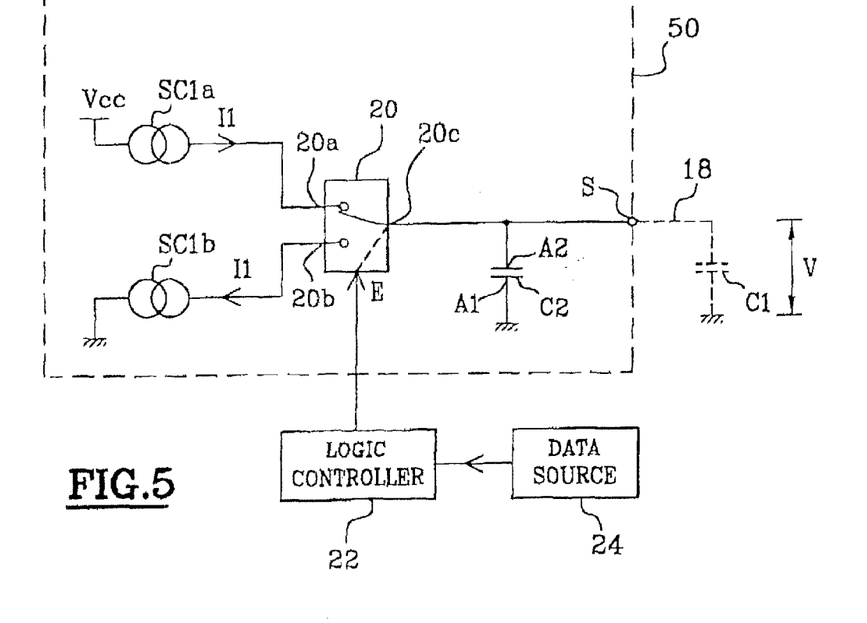
FIG. 5 is a diagram of a digital signal output circuit according to a first embodiment of the present invention.

FIG. 5 shows a first embodiment of a binary logic signal output circuit according to the present invention. The circuit includes a passive integrator that is formed by a capacitor C2 having a first terminal A1 connected to ground and a second terminal A2 selectively connected to one of first and second constant current sources SC1a or SC1b by a switch 20. The switch 20 has a first input 20a, a second input 20b, and an output 20c. The output 20c is selectively connected to one of the inputs 20a and 20b as a function of the logic state at a switching input E.

The switching input is connected to the output of a logic controller 22, which produces data for transmission along the transmission line 18 in the form of binary logic states. The logic controller 22 forms a data transmission interface for a data source 24 in communication with the transmission line 18. For example, the data source can be a peripheral such as a keyboard or a scanner. The first current source SC1a is connected to the first input 20a of the switch 20. The second current source SC1b is connected to the second input 20b of the switch.

Figure 6A:
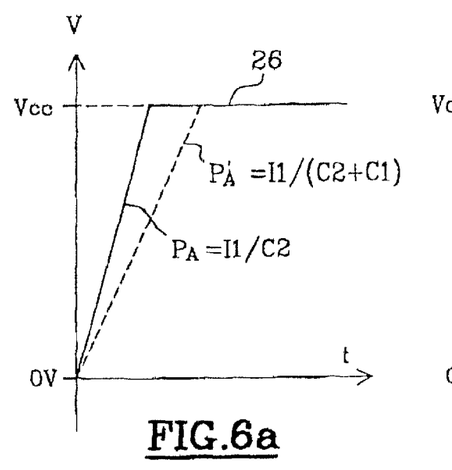
FIGS. 6a and 6b are timing diagrams of the output signals of the circuit of FIG. 5.
Figure 6B:
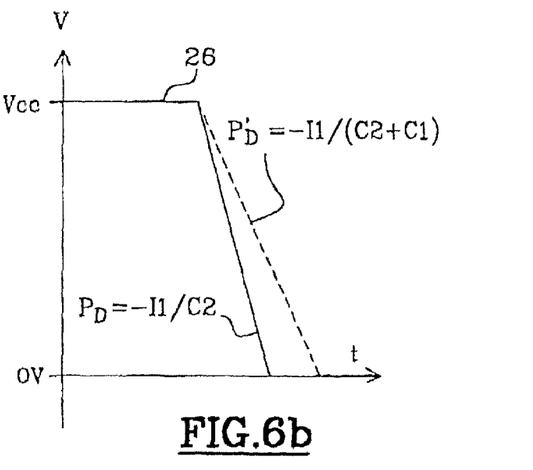

When the switching input E of the switch 20 is at logic level 1, the switch connects the first input 20a to the output 20c. The capacitor C2 is then charged with a constant current I1. If the capacitor C2 has a capacitance of $C_2$, the electrical charge it receives is $C_2 \times v$, where v is the voltage between the terminals of the capacitor. This charge, being supplied with the constant current I1, is equal to I1×t, where t is the time during which the current I1 passes through the capacitor. This then gives the condition: $v = I1 \times t / C_2$. This voltage v is reproduced at the output S of the circuit. Accordingly, when the logic controller 22 supplies a logic signal 1, the circuit delivers a rising edge whose slope $P_A$ is given by $P_A = I1/C_2$ at its output S, as shown in FIG. 6a.

In this exemplary embodiment, the first current source SC1a delivers a constant current with a voltage limited to Vcc. Consequently, as soon as capacitor C2 is charged to the voltage v=Vcc, the voltage v ceases to rise and remains fixed at the value Vcc for the entire time that the switching input E is at level 1, as shown by the horizontal portion 26 in the timing diagram. The transmission line 18 itself also forms a capacitor C1 of capacitance $C_1$ and thus modifies the shape of the voltage v. Because this capacitor is in parallel with capacitor C2, the total capacitance at the output S is $C_1 + C_2$. Taking this capacitance into account, the slope of the rising edge becomes $P'_D = I1/(C_1+C_2)$.

When the logic controller 22 produces a zero logic level at input E of switch 20, the switch connects capacitor C2 to the second constant current source SC1b, which operates to drain a constant current I1 from capacitor C2 to ground. In the case in which the capacitor C2 is already charged at the voltage v=Vcc, the capacitor C2 will then discharge at a constant rate I1 until its voltage v reaches the ground voltage of 0 V. Once this ground voltage is reached, the signal at the output S is kept at the ground voltage until a logic signal 1 reappears at input E of switch 20.

In this embodiment, the discharge current I1 has the same magnitude as the charging current, with the only difference being in the sign. Accordingly, the falling edge of the voltage signal at output S has the same magnitude, but is preceded by a negative sign. Thus, it is given by $P'_D = -I1/C_2$, and there is obtained a perfect symmetry between the rising and falling edges. If the capacitance $C_1$, connected to the capacitive load of transmission line 18 is taken into account, the slope of the falling edge is modified in the same way, and becomes $P'_D = -I1/(C_1+C_2)$.

Figure 7:
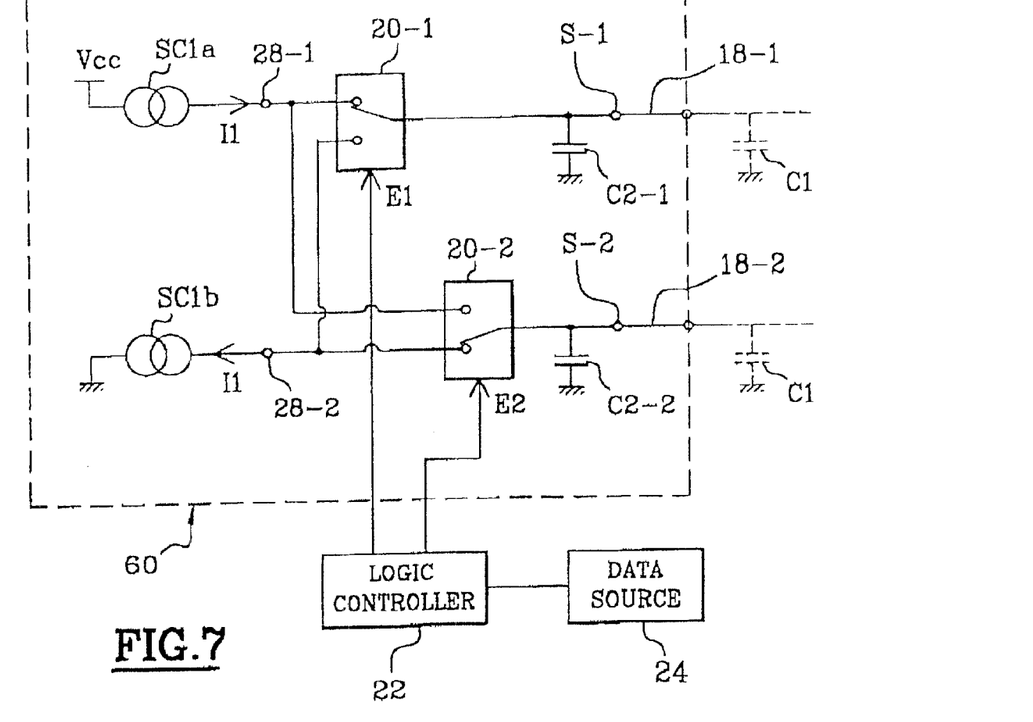
FIG. 7 is a diagram of a digital signal output circuit according to a second embodiment of the present invention that provide signals in the form of differential pairs.

For sending logic signals in the form of differential pairs, two output circuits of the type shown in FIG. 5 are used, as shown in the second embodiment of FIG. 7. In FIG. 7, circuit elements that are the same as the elements of FIG. 5 are designated by the same reference numerals. Additionally, when a circuit element is doubled, the two resulting elements are designated as "–1" and "–2". The circuit 60 of FIG. 7 includes two outputs S-1 and S-2 that deliver the two components of differential binary logic signals of differential pairs on transmission lines 18-1 and 18-2, respectively.

Each of the outputs S-1 and S-2 is connected to its own integrating capacitor C2-1 and C2-2. Each of the capacitors C2-1 and C2-2 is selectively connected to first and second current sources SC1a and SC1b via its own switch 20-1 and 20-2 in the same manner as in the circuit of FIG. 5. Each switch has its switching input E-1 and E-2 connected to an adapted output of the logic controller 22. The operation of circuit 60 of FIG. 7 at the level of each output S-1 or S-2 is the same as in the circuit 50 of FIG. 5 and shall not be repeated for conciseness. In the second embodiment, the switches 20-1 and 20-2 are connected in phase opposition, so that when one is switched to the first constant current source SC1a, the other is systematically and simultaneously switched to the second constant current source SC1b, and vice versa. Accordingly, the binary logic signals on the transmission lines 18-1 and 18-2 are always in opposition, as shown in FIG. 3.

Figure 8:
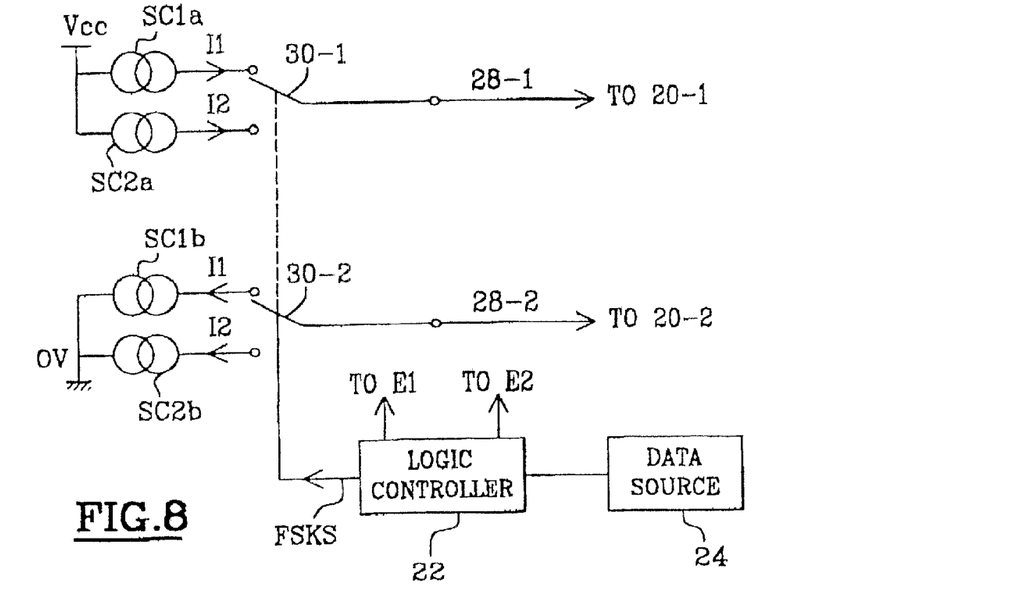
FIG. 8 is a diagram of a digital signal output circuit according to a third embodiment of the present invention that allows a selection between two rise and fall times for the signals.

FIG. 8 shows third embodiment of the present invention that is adapted to produce two degrees of slope in the rising and falling edges of the digital logic signals. To this end, the circuit includes two constant current sources SC1a and SC2a for charging capacitors C2-1 and C2-2 and two constant current sources SC1b and SC2b for discharging the capacitors C2-1 and C2-2. The additional constant current sources SC2a and SC2b are each adjusted for charging or discharging a current of the same magnitude I2, which is different from magnitude I1 obtained from the constant current sources SC1a and SC1b.

Two switches 30-1 and 30-2 are provided to allow the output circuit to use one of the pairs of constant current sources SC1a and SC2b or SC2a and SC2b. The switches 30-1 and 30-2 are provided between the outputs of the pairs of current sources and nodes 28-1 and 28-2 of FIG. 7. In this exemplary embodiment, the switches 30-1 and 30-2 are controlled by an output LS/FS of the logic controller 22. The circuit of FIG. 8 makes it possible to change the waveform of the output signals to satisfy different characteristics with regard to the rise and fall times of the binary signals. For example, currents I1 and I2 can be adjusted so as to correspond to the edges conforming to full speed transmission (rise time or fall time between 4 ns and 20 ns) and low speed transmission (rise time or fall time between 75 ns and 300 ns) according to the USB standard.

Figure 9:
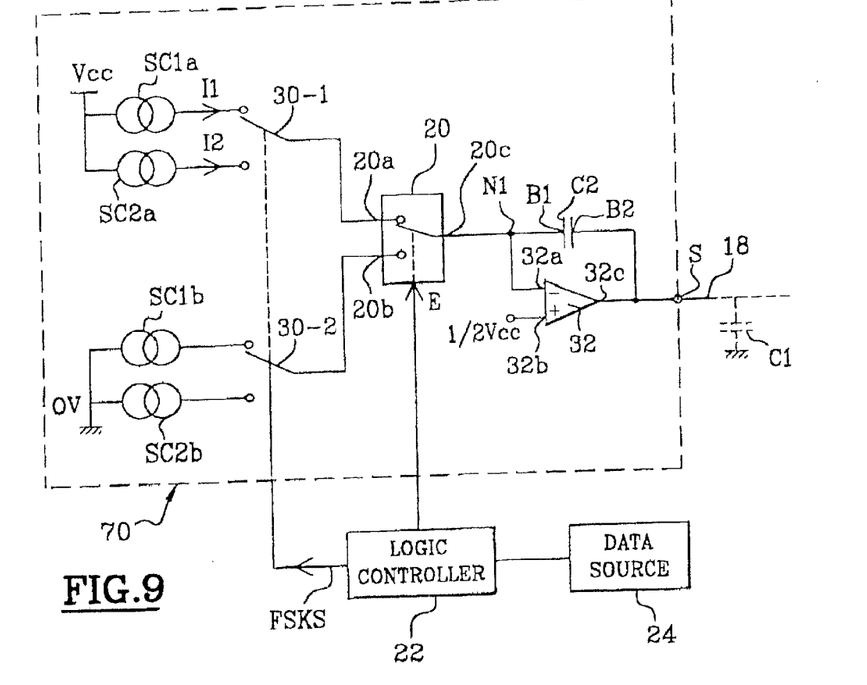
FIG. 9 is a diagram of a digital signal output circuit according to a fourth embodiment of the present invention.

FIG. 9 shows a fourth embodiment of the present invention that is based on an active integrator. In FIG. 9, elements that having an analogous role to the elements described above with reference to FIGS. 5, 7, and 8 have the same reference numerals and shall not be described again for conciseness. The circuit 70 of the fourth embodiment differs from those of FIGS. 5, 7, and 8 by the fact that the ground connection of capacitor C2 is replaced by an operational amplifier 32 that forms an active integrator.

More specifically, a capacitor C2 has a first input terminal B1 connected to the inverting (negative) input 32a of the operational amplifier 32 and a second terminal B2 connected to the output 32c of the operational amplifier so as to form a feedback loop. The non-inverting (positive) input 32b of operational amplifier 32 is held at a fixed potential, which is equal to ½ Vcc in this exemplary embodiment. Switch 20 has its output 20c connected via node N1 to the first terminal B1 of capacitor C2, and thus also to the inverting input 32a of the operational amplifier 32.

As in the embodiment of FIG. 8, switches 30-1 and 30-2 are provided to allow the two inputs 20a and 20b of switch 20 to be selectively connected to either constant current sources SC1a and SC1b or constant current sources SC2a and SC2b under the control of the LS/FS control output of the logic controller 22. Switches 30-1 and 30-2 respectively connect inputs 20a and 20b of switch 20 to current sources SC1a and SC1b. Switch 20 then connects node N1 to the constant current source SC1a when the logic controller 22 sends a logic 1 signal to the control input E, and connects node N1 to current source SC1b when the logic controller sends a logic 0 signal to the control input E. The output 32c of the operational amplifier 32 produces a voltage signal in the form of a ramp given by the charge of the capacitor C2 obtained by constant current generator SC1a.

A case in which switch 20 switches to connect node N1 to constant current source SC1a (subsequent to a logic 1 signal appearing at input E) while node N1 was previously at 0 V level will now be explained. The voltage at the inverting input 32a of operational amplifier 32 will increase starting from the value 0 V as capacitor C2 charges with the constant current I1. Consequently, the voltage at the output 32c of the amplifier will increase correspondingly from 0 V to Vcc. As with the circuit of FIG. 5, the rate at which the output signal rises is proportional to the rate of charge of capacitor C2. This rate is linear in time since the charging current is constant and is equal to $I1/C_2$ (neglecting the capacitance $C_1$ of the data transmission line).

Figure 10A:
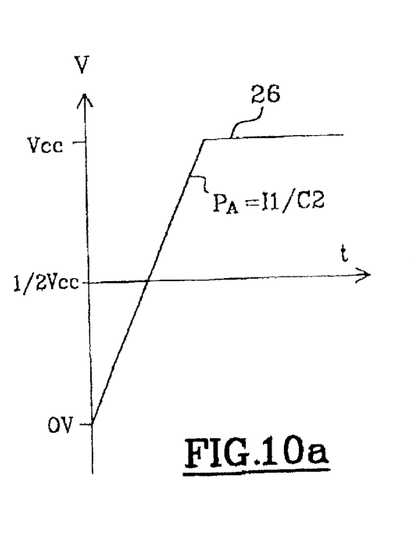
FIGS. 10a and 10b are timing diagrams of the signals output from the circuit of FIG. 9.

Capacitor C2 will stop being charged when the current source supplies the charging current I1 at its maximum voltage, which is fixed at Vcc. FIG. 10a shows the change in the digital binary signal when switch 20 connects node N1 to current source SC1a while node N1 was previously at the 0 V level. As capacitor C2 charges, the output signal exhibits a rising edge from 0 V to Vcc with a slope $P_A=I1/C_2$. When capacitor C2 is charged to the supply voltage Vcc, the output voltage signal stabilizes at Vcc (portion 26 of the timing diagram).

Figure 10B:
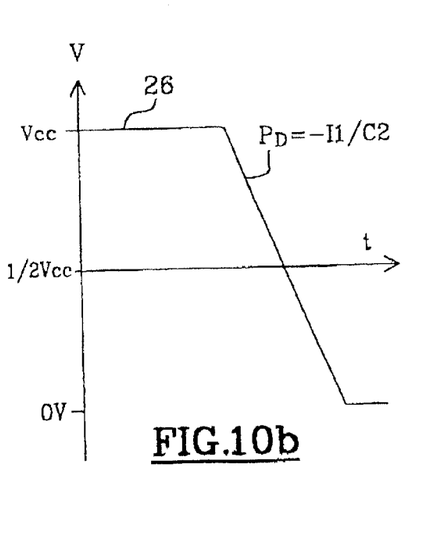

A case in which switch 20 switches to connect node N1 to the constant current source SC1b (subsequent to a 0 logic signal appearing at input E) while node N1 was previously at the supply voltage Vcc will now be explained. The voltage at the inverting input 32a of the operational amplifier 32 decreases from the value Vcc as capacitor C2 discharges with the constant current I1. Accordingly, the voltage at the output 32c of the amplifier decreases correspondingly from Vcc to 0 V at a rate equal to $-I1/C_2$ (neglecting the capacitance $C_1$ of the data transmission line). Capacitor C2 ceases to discharge when the current source reaches its minimum value, which is fixed at 0 V. FIG. 10b shows the change in the digital binary signal when switch 20 connects node N1 to current source SC1b while node N1 was previously at the supply voltage level Vcc. As capacitor C2 discharges, the output signal exhibits a falling edge from Vcc to 0 V with a slope $P_D=-I1/C_2$. When capacitor C2 is discharged to the 0 V level, the output signal stabilizes at 0 V (portion 26 of the timing diagram).

These operating principles remain the same when the switches 30-1 and 30-2 connect current sources SC2a and SC2b. When the output S is connected to a data transmission line 18 having a capacitance $C_1$, this capacitance is in effect charged (for a rising edge) or discharged (for a falling edge) with the constant current I1. Moreover, the charge of this capacitance $C_1$ is controlled by the feedback loop (provided by the feedback of capacitor C2) by comparing the voltage at the terminals of capacitor C1 with respect to the charge of capacitor C2 in its integrator configuration.

Figure 11:
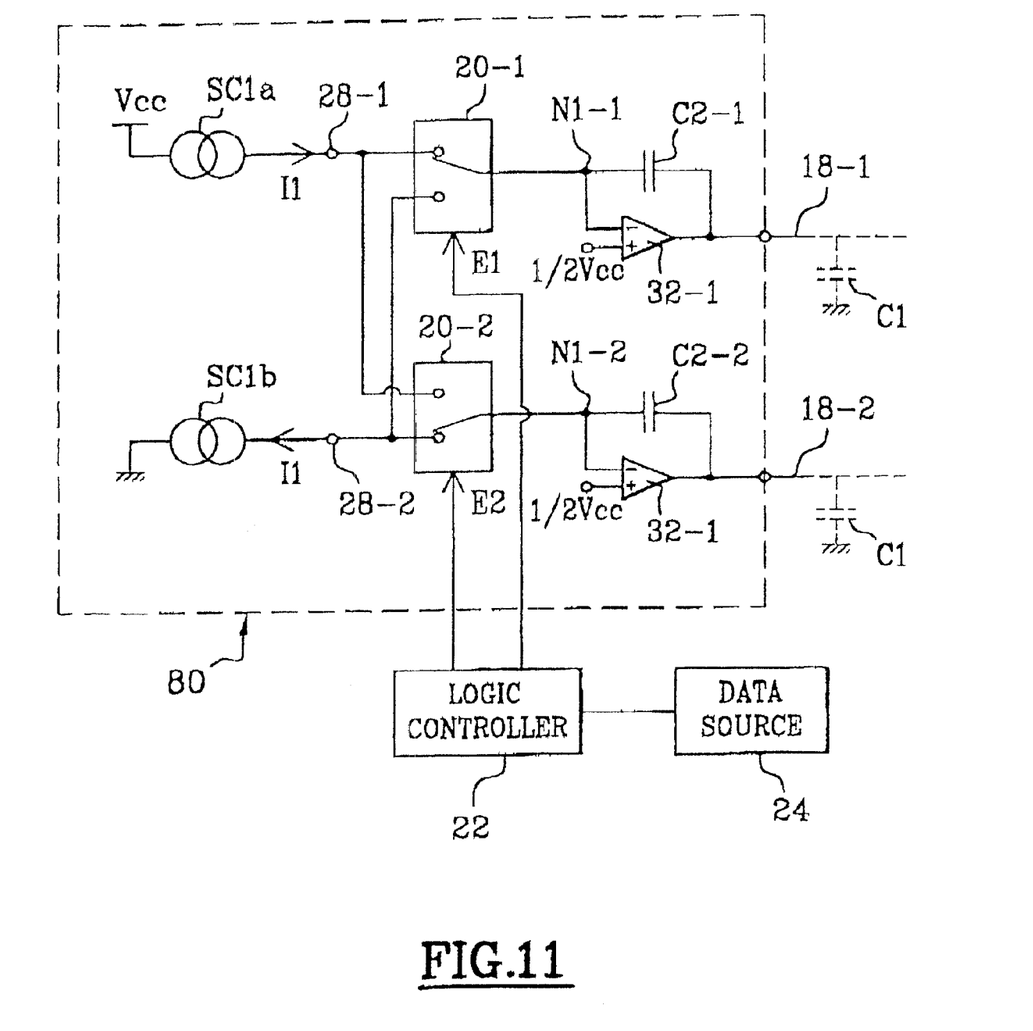
FIG. 11 is a diagram of a digital signal output circuit according a fifth embodiment of the present invention that supplies output signals in the form of differential pairs.

FIG. 11 shows an output circuit according to a fifth embodiment of the present invention that is adapted to supply binary digital signals in the form of differential pairs. The circuit 80 of FIG. 11 includes two of the circuits 70 of FIG. 9, in a manner analogous to the circuit 60 of FIG. 7. As in circuit 60 of FIG. 7, the two constant current sources SC1a and SC1b are alternately shared between the two integrators. Consequently, switch 20-1 connects current source SC1a to node N1-1 of the active integrator formed by the operational amplifier 32-1 and its feedback capacitor C2-1, and switch 20-2 connects current source SC1b to node N1-2 of the active integrator formed by the operational amplifier 32-2 and its feedback capacitor C2-2, and vice versa.

Accordingly, the binary logic signals on the output lines 18-1 and 18-2 of the integrators have complementary logic states. Further, the crossover points between the rising and falling edges of the two output signals are symmetrical and located at the median voltage level of ½ Vcc. Thus, these signals have a waveform that complies with the theoretical waveforms shown in FIG. 3. Naturally, the circuit 80 of FIG. 11 can have similar features to the circuit of FIG. 8 so as to selectively use two supplementary current sources SC2a and SC2b under the same conditions. In such a case, the two constant current sources SC1a and SC1b of FIG. 11 are replaced by the circuit configuration shown in FIG. 8, with the output points 28-1 and 28-2 connected to the points bearing the same reference numerals in FIG. 11.

In the embodiments of the present invention described above, it is also possible for each integrator circuit to have its own charging and discharging current source. Each integrator circuit can even have several charging and discharging sources which are specific to itself (for example, to obtain currents I1 and I2 in a manner analogous to the circuit of FIG. 9).

Figure 12:
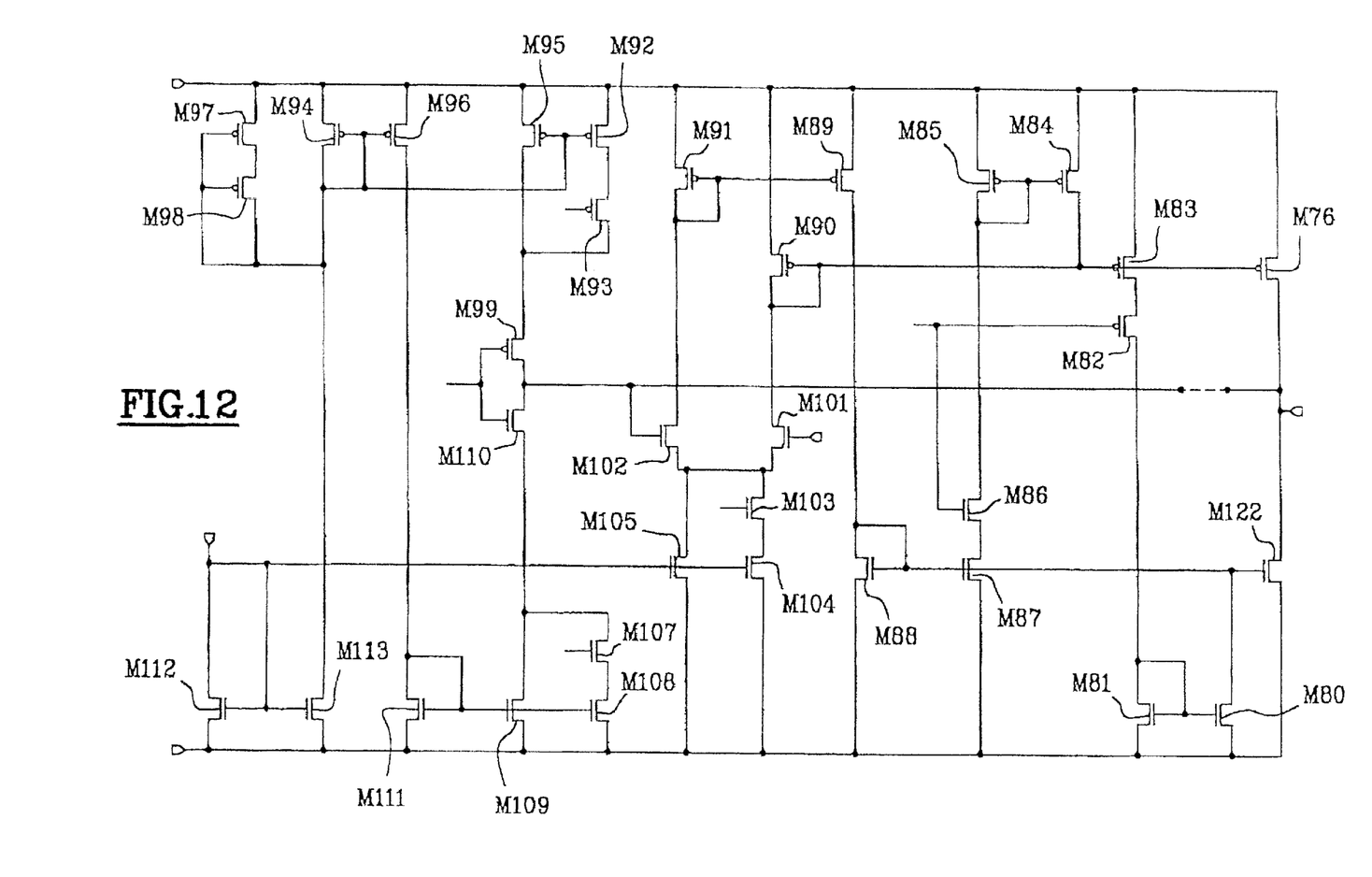
FIG. 12 is a schematic diagram showing in detail one exemplary embodiment of the circuit of FIG. 9.

FIG. 12 is a detailed schematic diagram of one exemplary embodiment of the binary signal output circuit of FIG. 9. The logic controller 22 and the data source 24 are not shown in FIG. 12. All of the elements of the circuit 70 are formed by MOS transistors which can be integrated on a single substrate. The capacitor C2 can also be integrated on the substrate. The constant current sources are formed from current mirrors that are supplied by a constant reference current injected at a node IB, and can also be produced on a parasitic PNP bipolar+CMOS type single substrate.

The current mirror is formed by transistors M96, M109, M108, M95, M92, and M111. These transistors form the two current generators I1 and I2. The selection of one of the current sources is effected by switches M93 and M107. A transistor pair M99 and M110 allows the selection of the direction of the currents I1 or I2, and thus switches between the charging and discharging states of capacitor C2. These transistors are functionally equivalent to switch 20. Transistors M105 and M104 supply a differential biasing current. Transistor M103 allows this current to be increased when the circuit operates in the high speed mode (for example, as established by the USB specification).

Figure 13:
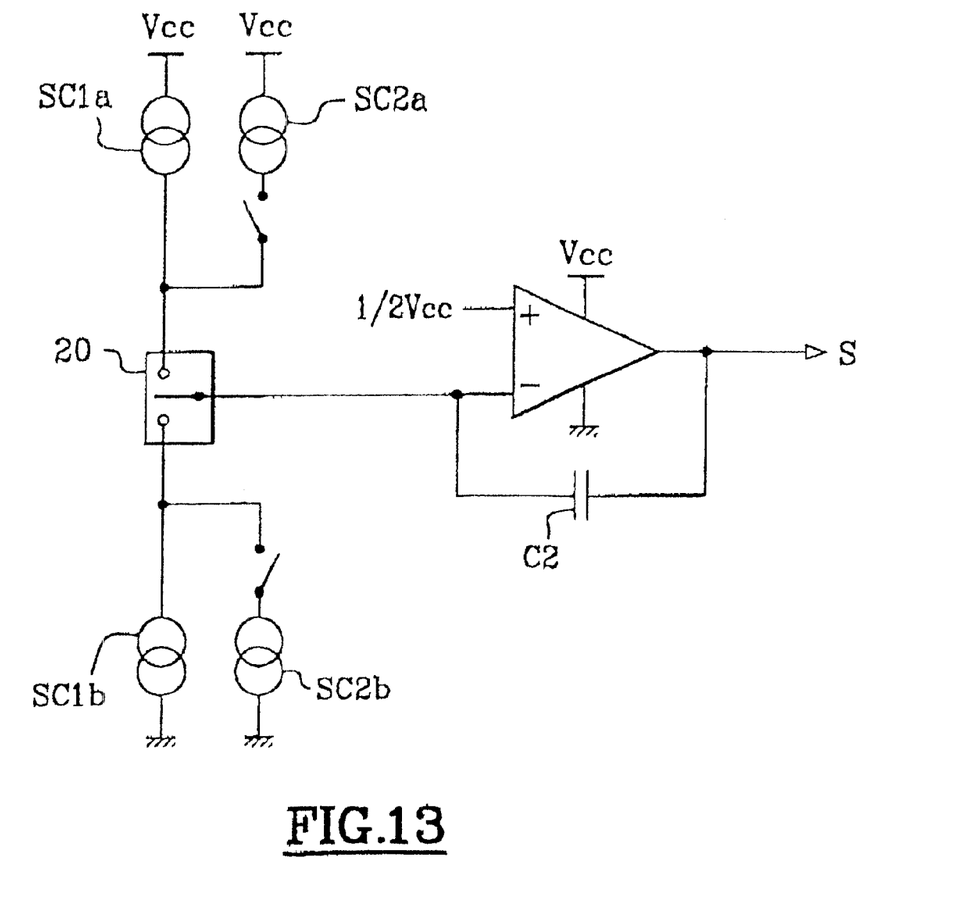
FIG. 13 shows the functional elements of the circuit of FIG. 12.

Transistors M91, M89, M88, and M122, which discharge capacitor C2, and transistors M90 and M76, which charge capacitor C2, are connected as a current mirror, so as to obtain the desired current at the transconductor output. Further, transistors M87, M86, M85, and M84 are connected as a current mirror and serve to more rapidly set output transistor 76 to the OFF state. Likewise, transistors M83, M82, M81, and M80 are connected as a current mirror and serve to set transistor M122 to the OFF state by more rapidly discharging its gate. Node M1 receives the common mode voltage of ½ Vcc. FIG. 13 shows the structure of the circuit of FIG. 12 in the form of functional blocks.

The present invention is not limited to the shaping of binary logic signals, whether or not they are in the form of differential pairs. The present invention can be applied in all areas of electronics in which there exists a need to supply signals in the form of waveforms having well-controlled and stabilized rising and falling edges. Further, the number of different current sources used with the output circuit according to the present invention is not limited to one or two, but can be any number and is chosen according to the specific application.

Moreover, it is possible to control the slope of the rising or falling edges in ways other than by acting on the charging and discharging currents. For example, it is possible to obtain an equivalent result by modifying the value of the capacitor C2, and this can be achieved by selectively putting different capacitor elements into circuit (using a configurable array of capacitors in series or in parallel). Additionally, the levels of the signals used in the above description are purely arbitrary and the present invention can be implemented using other voltage or current thresholds.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A digital signal output circuit for transmitting data in a digital signal, said digital signal output circuit comprising:
    capacitor forming means connected as an integrator;
    charging means for selectively charging the capacitor forming means with a constant charging current;
    discharging means for selectively discharging the capacitor forming means with a constant discharging current;
    means for selectively coupling the capacitor forming means to the charging means and to the discharging means as a function of data to be transmitted by the digital signal; and
    a digital signal output coupled to the capacitor forming means so as to establish a rising edge of the digital signal when the capacitor forming means is coupled to the charging means and a falling edge of the digital signal when the capacitor forming means is coupled to the discharging means,
    wherein the constant charging current and the constant discharging current have the same magnitude so as to produce the digital signal with symmetrical rising and falling edges,
    the capacitor forming means is connected as an active integrator,
    the capacitor forming means includes an operational amplifier and a capacitor,
    the charging means and the discharging means are selectively coupled to the inverting input of the operational amplifier,
    the non-inverting input of the operational amplifier is coupled to a reference potential, and
    the capacitor is coupled between the inverting input and the output of the operational amplifier.

2. The digital signal output circuit as defined in claim 1 wherein the charging means and the discharging means share the same references that determine their charging and discharging rates, respectively.

3. The digital signal output circuit as defined in claim 1, wherein the charging means and the discharging means are formed by current mirrors.

4. The digital signal output circuit as defined in claim 1 wherein the capacitor forming means has a capacitance that can be modified so as to allow characteristics of the digital signal to be modified.

5. The digital signal output circuit as defined in claim 1,
    wherein the means for selectively coupling includes a switch that is controlled by a switching logic signal, and
    the switch has a first input coupled to the charging means, a second input coupled to the discharging means, and an output coupled to the capacitor forming means.

6. The digital signal output circuit as defined in claim 1, further comprising means for selecting the magnitude of the constant charging current and the constant discharging current so as to allow selection of the shape of the digital signal.

7. The digital signal output circuit as defined in claim 6, wherein the charging means includes a plurality of individual constant current charging means and the discharging means includes a plurality of individual constant current discharging means, each of the individual means being set to its own constant current value and being selectively coupled to the capacitor forming means.

8. The digital signal output circuit as defined in claim 7 further comprising a logic controller for controlling the charging means and the discharging means.

9. A digital signal output circuit for transmitting data in a digital signal, said digital signal output circuit comprising:
    capacitor forming means connected as an integrator;
    charging means for selectively charging the capacitor forming means with a constant charging current;
    discharging means for selectively discharging the capacitor forming means with a constant discharging current;
    means for selectively coupling the capacitor forming means to the charging means and to the discharging means as a function of data to be transmitted by the digital signal; and
    a digital signal output coupled to the capacitor forming means so as to establish a rising edge of the digital signal when the capacitor forming means is coupled to the charging means and a falling edge of the digital signal when the capacitor forming means is coupled to the discharging means,
    wherein the constant charging current and the constant discharging current have the same magnitude so as to produce the digital signal with symmetrical rising and falling edges.

10. A digital signal output circuit for transmitting data in a digital signal, said digital signal output circuit comprising:

capacitor forming means connected as an integrator;

charging means for selectively charging the capacitor forming means with a constant charging current;

discharging means for selectively discharging the capacitor forming means with a constant discharging current;

means for selectively coupling the capacitor forming means to the charging means and to the discharging means as a function of data to be transmitted by the digital signal; and a digital signal output coupled to the capacitor forming means so as to establish a rising edge of the digital signal when the capacitor forming means is coupled to the charging means and a falling edge of the digital signal when the capacitor forming means is coupled to the discharging means, wherein the means for selectively coupling includes a switch that is controlled by a switching logic signal, and the switch has a first input coupled to the charging means, a second input coupled to the discharging means, and an output coupled to the capacitor forming means.

11. A digital signal output circuit for transmitting data in a digital signal, said digital signal output circuit comprising:

capacitor forming means connected as an integrator;

charging means for selectively charging the capacitor forming means with a constant charging current;

discharging means for selectively discharging the capacitor forming means with a constant discharging current;

means for selectively coupling the capacitor forming means to the charging means and to the discharging means as a function of data to be transmitted by the digital signal;

a digital signal output coupled to the capacitor forming means so as to establish a rising edge of the digital signal when the capacitor forming means is coupled to the charging means and a falling edge of the digital signal when the capacitor forming means is coupled to the discharging means; and means for selecting the magnitude of the constant charging current and the constant discharging current so as to allow selection of the shape of the digital signal, wherein the charging means includes a plurality of individual constant current charging means and the discharging means includes a plurality of individual constant current discharging means, each of the individual means being set to its own constant current value and being selectively coupled to the capacitor forming means.

12. A digital signal output circuit for outputting binary digital signals in the form of differential pairs on data transmission channels, said digital signal output circuit comprising:

a pair of capacitor forming means connected as integrators;

charging means for selectively charging the capacitor forming means with a constant charging current;

discharging means for selectively discharging the capacitor forming means with a constant discharging current;

means for selectively coupling the capacitor forming means to the charging means and to the discharging means as a function of data to be transmitted by the digital signal; and a pair of digital signal outputs, each of the digital signal outputs being coupled to one of the capacitor forming means so as to establish a rising edge of the digital signal at the digital signal output when the corresponding capacitor forming means is coupled to the charging means and a falling edge of the digital signal at the digital signal output when the corresponding capacitor forming means is coupled to the discharging means.

13. The digital signal output circuit as defined in claim 12, wherein the constant charging current and the constant discharging current have the same magnitude so as to produce digital signals with symmetrical rising and falling edges.

14. The digital signal output circuit as defined in claim 12, wherein the charging means and the discharging means are formed by current mirrors.

15. The digital signal output circuit as defined in claim 12, wherein the capacitor forming means are each connected as an active integrator.

16. The digital signal output circuit as defined in claim 15, wherein each capacitor forming means includes an operational amplifier and a capacitor, the charging means and the discharging means are selectively coupled to the inverting input of the operational amplifier, the non-inverting input of the operational amplifier is coupled to a reference potential, and the capacitor is coupled between the inverting input and the output of the operational amplifier.

17. The digital signal output circuit as defined in claim 12, wherein the means for selectively coupling includes a pair of switches that are controlled by a switching logic signal, and each switch has a first input coupled to the charging means, a second input coupled to the discharging means, and an output coupled to one of the capacitor forming means.

18. The digital signal output circuit as defined in claim 12, further comprising means for selecting the magnitude of the constant charging current and the constant discharging current so as to allow selection of the shapes of the digital signals.

19. The digital signal output circuit as defined in claim 18, wherein the charging means includes a plurality of individual constant current charging means and the discharging means includes a plurality of individual constant current discharging means, each of the individual means being set to its own constant current value and being selectively coupled to the capacitor forming means.

20. The digital signal output circuit as defined in claim 19, further comprising a logic controller for controlling the charging means and the discharging means.

21. The digital signal output circuit as defined in claim 12, wherein each of the capacitor forming means has a capacitance that can be modified so as to allow characteristics of the digital signals to be modified.

22. The digital signal output circuit as defined in claim 12, wherein the charging means and the discharging means are shared by the pair of digital signal outputs of the pair of data transmission channels, and one of the constant charging current and the constant discharging current is coupled to each of the digital signal outputs by switching means.

23. The digital signal output circuit as defined in claim 12, wherein each of the digital signal outputs has its own charging means and discharging means.

24. The digital signal output circuit as defined in claim 12, wherein the means for selectively coupling operates, as a function of data to be transmitted, to couple one of the capacitor forming means to the charging means and the other of the capacitor forming means to the discharging means such that the digital signals at the pair of digital signal outputs are always in opposition.

* * * * *